United States Patent [19]

Peter

[11] Patent Number: 5,618,575
[45] Date of Patent: Apr. 8, 1997

[54] PROCESS AND APPARATUS FOR THE PRODUCTION OF A METAL OXIDE LAYER

[75] Inventor: Günter Peter, Plons, Switzerland

[73] Assignee: Balzers Aktiengesellschaft, Furstentum, Liechtenstein

[21] Appl. No.: 427,658

[22] Filed: Apr. 21, 1995

Related U.S. Application Data

[63] Continuation of Ser. No. 86,011, Jul. 1, 1993, abandoned.

[30] Foreign Application Priority Data

Jul. 2, 1992 [CH] Switzerland ............... 2095/92

[51] Int. Cl.⁶ ............... C23C 14/08; C23C 16/00
[52] U.S. Cl. ............... 427/8; 427/567; 427/527; 427/529; 427/255.3; 204/192.13
[58] Field of Search ............... 427/294, 295, 427/255.3, 566, 567, 255.4, 529, 528, 8, 9, 10; 117/108, 918, 944, 948, 950; 204/192.13, 192.15, 192.22

[56] References Cited

U.S. PATENT DOCUMENTS

| | | | |
|---|---|---|---|
| 4,113,599 | 9/1978 | Gillery | 204/192.13 |
| 4,379,040 | 4/1983 | Gillery | 204/192.13 |
| 4,451,499 | 5/1984 | Morimoto et al. | 117/108 |
| 4,800,100 | 1/1989 | Herbots et al. | 427/527 |
| 4,888,202 | 12/1989 | Murakami et al. | 117/108 |
| 4,923,585 | 5/1990 | Krauss et al. | 204/192.11 |
| 4,936,964 | 6/1990 | Nakamura | 204/192.13 |
| 4,975,168 | 12/1990 | Ohno et al. | 204/192.13 |
| 5,016,563 | 5/1991 | Murakami et al. | 117/108 |
| 5,227,364 | 7/1993 | Fujiwara et al. | 427/526 |
| 5,347,157 | 9/1994 | Hung | 257/627 |
| 5,362,711 | 11/1994 | Takada et al. | 427/576 |
| 5,387,459 | 2/1995 | Hung | 428/204 |
| 5,403,433 | 4/1995 | Morrison et al. | 204/192.13 |
| 5,422,338 | 6/1995 | Watanabe | 427/62 |
| 5,499,599 | 3/1996 | Lowndes et al. | 204/192.13 |

FOREIGN PATENT DOCUMENTS

| | | |
|---|---|---|
| 0302506 | 8/1988 | European Pat. Off. . |
| 2341668 | 9/1977 | France . |
| 2158104 | 4/1985 | United Kingdom . |
| 9002215 | 3/1990 | WIPO . |

*Primary Examiner*—Marianne Padgett
*Attorney, Agent, or Firm*—Notaro & Michalos P.C.

[57] ABSTRACT

A process and apparatus for producing a metal oxide layer which is selectively permeable to ions of a given class, comprises evacuating a vacuum chamber, evaporating metal particles in the chamber and imparting to the particles kinetic energy which is at 10 eV maximum, introducing oxygen into the chamber with a quantity of oxygen being controlled to deposit a metal oxide on a substrate in the chamber, while the substrate is maintained below 900° C.

35 Claims, 7 Drawing Sheets

PROCESS AND APPARATUS FOR THE PRODUCTION OF A METAL OXIDE LAYER

This application is a continuation of U.S. application Ser. No. 08/086,011, filed Jul. 1, 1993, abandoned.

FIELD AND BACKGROUND OF THE INVENTION

The present invention relates to a process for the production of an extremely selective ion-permeable metal oxide layer on a substrate, a vacuum treatment apparatus for carrying out the stated process as well as a part coated with at least one metal oxide layer. In this disclosure the term "metal oxide" should also be understood to include the oxides of semiconductors.

It is known that metal oxide layers of this type are used in many applications. Without claiming completeness they are used:

as dielectrics for the electronic insulation between conducting layers, as dielectrics in thin-film capacitors, as protective layer for encapsulating for example integrated circuits, as insulators between superconductors for the production of fast switches according to the Josephson effect (Rosenberg, "The Solid State", Oxford University Press, 1988), for layer structures in solar cells, for layer structures in optical components, as gas sensors because of their properties as solid-state electrolytes, on electrochemical half cells for measuring electromotive force, in particular also for measuring pH, therein also for ion-sensitive semiconductor components, such as GATE layers for field effect transistors, so-called ISFETs.

In all of these applications an essential requirement made of the layer is that no microcracks are present in the layer. Microcracks of this type can abolish the function of the oxide layer in all cases. For example, when using the layer as pH sensor layer, microcracks of this type shortcircuit the layer.

A further essential requirement in all stated applications is that of good adhesion to the base, in particular also under the aspect of thermal stresses as well as absence of interference sites or inclusions of foreign bodies.

SUMMARY OF THE INVENTION

It is the goal of the present invention to provide a method of the above stated type by means of which the stated metal oxide layers can be fabricated on an industrial scale and therein meet the stated requirements regarding microcracks, absence of interference sites and adhesive strength, as well as a vacuum treatment installation by means of which the stated layers can be produced, as well as, further, parts which following industrial production meet the stated requirements.

The stated task is solved through a process which is distinguished according to the invention where the following definitions apply:

a high vacuum range or HV is between $10^{-1}$ and $10^{-6}$ mbars, and an ultra high vacuum range or UHV is pressures below $10^{-6}$ mbars.

When calling for at least high vacuum range, this means HV and UHV.

If, furthermore, $Me_hO_k$ is the stoichiometry form of a desired oxidation stage (for example $Si_1O_2$, $Si_1O_1$) wherein h and k are positive integers, and if the molar mean instantaneous ratio in the solid state normalized to h between metal and O is given by h/k', the degree of oxidation $\gamma$ is then given by k'/k, and the following applies:

at k'/k=1: the oxidation is saturated;

at k'/k>1: the oxidation is supersaturated, and at k'/k<1: the oxidation is incomplete.

With respect to the production of oxide layers in a UHV vacuum atmosphere, reference is made to the article "Coevaporation of Y-Ba-Cu-O films in an ultra high vacuum plant", J. Edlinger, H. Fischer, J. A. Koprio, G. Peter, J. Ramm, Balzers AG, Fl-9496 Balzers, from Proceedings of the International Conference on High Temperature Superconductivity and Materials and Mechanisms of Superconductivity, Feb. 29 to Mar. 4, 1988, Interlaken, Switzerland.

Through the initial evacuation at least to the HV pressure range the flaw inclusion rate in the layer is minimized. Further, through the combination of the features, the metal is set free, the kinetic energy of freed metal particles on the substrate is maximally 10 eV, and the ratio of the quantity of oxygen introduced per unit time to the quantity of metal released per unit time is selected so that on the substrate, metal oxide is built up having a degree of oxidation which can be predetermined, and, further, the substrate temperature is kept below 900° C. A precisely controllable application process is thus realized. Thereby the energy of the metal particles impinging on the substrate is limited to a maximum, and work takes place on a metal particle source contrary to conventional efforts for commercial industrial fabrication of layers with a low rate of release of the metal particles. In order to optimize further the adhesion of the deposited layer, other steps are suggested for the proceed according to the invention.

It is thereby achieved that with precise control a desired oxidation degree profile between substrate and layer is lastly achieved with the desired stoichiometry whereby, for example, the absorption of thermal stresses between substrate and layer can be optimized without the formation of cracks.

Moreover, the metal, according to other features of the invention, is preferably set free in the vacuum chamber.

Furthermore, the procedure is preferably followed which permits controlling precisely the rate of release and makes it possible to realize precisely the stated oxidation degree profile in accordance with the simultaneously supplied quantity of oxygen per unit time according to a predetermined reference profile.

Following other features of the process, relatively thick, highly homogeneous layers can be generated with continuously controlled stoichiometry so that the drift of the rate of the metal set free averaged over time and over the area of release is maintained at less than 5% in 20 minutes, preferably less than 0.5% in one hour.

By area of release the entire area of a metal particle source from which metal particles are given off within the coating time is to be understood.

Through the simultaneous action on the substrate, according to other features of invention by oxygen and metal particles, an oxide layer is grown in situ. Passivation effects such as for example with anodic oxidation in the atmosphere or electrochemical oxidation cannot occur. Since the deposition process takes place with very low kinetic energy, significantly less than the binding energy of the oxide, the properties of already deposited oxides are not changed by subsequently deposited particles.

The entire suggested process according to the invention can be mastered with the control of a few process parameters, namely, as stated, the rate of release of the metal, furthermore the quantity per unit time of admitted oxygen, and further the temperature of the substrate upon which the layer grows.

The metal is preferably released through vaporization, therein preferably through electron beam vaporization, a process which is precisely controllable in particular in the way still to be described.

For the precise monitoring of the quantity of metal set free per unit time, this quantity is measured during the coating process.

In order to obtain relevant information from the measurements carried out about the rate of metal deposited on the average on the substrate, the measurement is carried out in the solid angle range at which the substrate with its region to be coated sees the source of the released metal. Therewith proportionality exists essentially between the quantity of metal per unit time determined at the measurement site and the quantity of metal per unit time and area deposited on the substrate.

The measurement is furthermore carried out so that at a constant quantity of oxygen supplied per unit time, the degree of oxidation on the growing layer is regulated or set to an average if the quantity of oxygen supplied per unit time is set to an average.

For minimizing flaw inclusions, further, according to the invention, the vacuum chamber is evacuated to the UHV pressure range before the coating process is started by which residual or background gas influences are avoided.

Moreover, in order to improve further the in-situ growth of the metal oxide layer free of residual gas inclusions, it is suggested to proceed according to the another formulation of the invention.

In particular for the precise regulation of the quantity of metal set free per unit time by the metal source a rate sensor is used according to the invention.

A response time preferably selected to $\leq 1$ msec in particular the time of flight of particles electronbeam vaporized at the stated maximum kinetic energy of approximately 10 eV over a path of 50 cm, is used. This is consequently the time of flight between the source and a substrate to be coated, mounted with respect to the source at a distance of 50 cm.

Moreover, the rate sensor used for measuring the rate of the metal set free is preferably disposed according to the invention preferably by providing a pressure stage, realized between the metal source and the rate sensor, on the one hand, and oxygen inlet and substrate, on the other hand. In a preferred embodiment of the process according to the invention the procedure is operated so that two of the three parameters are preferably kept constant, namely, substrate temperature per unit time and quantity of oxygen introduced per unit time or rate of release. Preferably in the production of a desired profile of the oxidation degree up to and with the further coating with the layer of desired stoichiometry, the substrate temperature and either the quantity of oxygen supplied per unit time or the quantity of metal set free per unit time are kept constant and, accordingly, the quantity of metal set free per unit time or the quantity of oxygen supplied are controlled in the sense of regulation according to the invention.

In some applications of the stated metal oxide layer it should be produced unilaterally or bilaterally in contact with a metal surface, wherein preferably in that case as the metal is selected the metal which also forms the oxide of the layer. Contributing to the formation of microcracks, as has been stated, is the adhesion of the metal oxide layer produced according to the invention on the substrate, in the present case on the at least one metal surface stated.

This adhesion is significantly increased when proceeding according to the invention.

According to another feature of the invention, the degree of oxidation of the layer being grown is carried out in particular by keeping constant the substrate temperature as well as by setting the quantity of oxygen introduced per unit time at greater setting floating time intervals, wherein, in a lesser setting floating time raster, the rate of the quantity of metal set free is set. This is done because setting floating steps and adjusting times of the released metal rate, in particular in the case of the suggested vaporization rate regulation still to be described, are significantly finer or shorter than setting times of gas inflow regulations taking into consideration their lesser reactivity brought about by feed lines and the like.

According to the invention, excited oxygen can be used as the oxygen, in the form of ozone and/or oxygen monomer and/or electron excited oxygen or ions. Also, the kinetic energy of the excited oxygen should herein not exceed 10 eV in order to increase therewith only the oxidation yield and in order to achieve no undefined influencing first of the substrate properties and secondly of the layer surface properties occurs.

A vacuum treatment apparatus for carrying out the explained process or with the vacuum treatment apparatus according to the invention at unexpectedly low rates of discards, parts can be coated according to the invention. According to the invention, 46 parts coated with at least one metal oxide layer can be produced simultaneously, without an oxidation degree transition profile, of which at a given area of the individual parts of at least 15 mm$^2$ at least 30%, preferably at least 40% of the parts maximally are selectively conducting for given ions and consequently are usable as sensors. But if these parts are additionally built with advantageously constant oxidation degree, the stated yield is more than 90%, on the one hand, and the service life of the parts, for example as sensors, is simultaneously significantly increased.

The stated percentage of yield relates to the dimension of the area of coating of at least 15 mm$^2$. Consequently, for example a yield of 90% means that of 1500 mm$^2$ of the coated area 1350 mm$^2$ are free of microcracks.

The parts can therein already be coated as such or first as "gross substrate", which subsequently, such as for example through a laser cutting process, are divided into the individual parts to be used.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the following the invention will be explained by example in conjunction with figures, wherein.

DESCRIPTION OF THE PREFERRED EMBODIMENTS

With reference to a preferred embodiment of the process according to the invention as well as the apparatus according to the invention, an electron beam vaporizer is used as the metal source, and this for achieving extremely high precision with respect to rate control is preferably carried out by means of an electron beam source, as is described in the present assignee's patent documents DE-OS-39 21 040 as well as DE-OS-39 29 475 or according to the regulation process described there. The U.S. patent equivalents of these two publications, U.S. Pat. Nos. 5,041,712 and 5,038,044, are herewith declared to be integral components of the present specification and are incorporated by reference.

Figure 1:
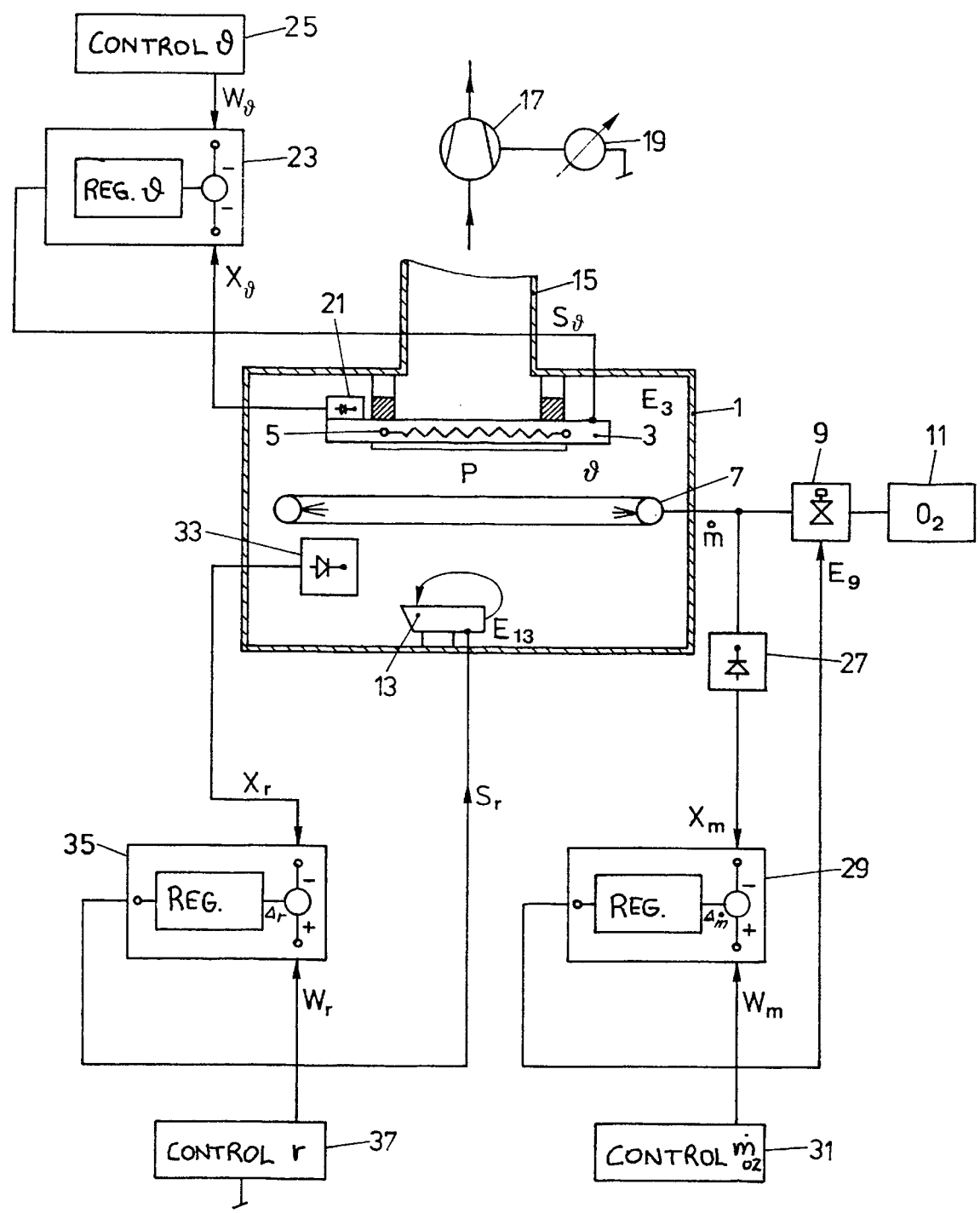
FIG. 1 is a schematic diagram which explains the process according to the invention, and illustrates an embodiment of a vacuum treatment apparatus according to the invention.

FIG. 1 schematically depicts a preferred embodiment of a vacuum treatment apparatus according to the invention, in conjunction with which the process according to the invention will also be explained.

In a vacuum chamber 1 of known type in order to fulfill the requirement of the high vacuum range or the ultra high vacuum range, in known manner a movable or, as shown, stationary workpiece carrier 3 is provided. The workpiece carrier 3 is heatable as is depicted schematically by heating element 5. In the vacuum chamber 1 is provided opposing the workpiece carrier 3 a gas shower 7, preferably implemented as an annular encircling gas shower, as shown, which is connected via a mass flow final control element 9 with an oxygen reservoir tank 11. The setting element 9 is controllable at an input $E_9$.

With respect to the gas inlet arrangement 7 opposing the workpiece carrier 3, is provided an electron beam vaporization source with electron beam generator 13. With respect to the preferred structure of the electron beam vaporization unit reference is made in particular to FIG. 8 and associated specification of U.S. Pat. No. 5,038,044 and German DE-OS-39 29 475.

It is essential that the electron beam vaporization or release unit 13 comprises a control input $E_{13}$ by means of which the vaporization rate r, defined as quantity of metal per unit time and averaged over the release or vaporization surface of the source, can be set sufficiently fast and sufficiently precisely so that, as will be described, this rate from one deposited molecular layer to the next can be changed as desired. Preferably at the electron beam vaporization unit 13 a vaporization rate averaged over time of less than 0.3 nms$^{-1}$, preferably 0.1 nms$^{-1}$, preferable even 0.01 nms$^{-1}$, even 0.005 nms$^{-1}$ can be set wherein it is understood that this rate cannot vanish.

Furthermore, at the electron beam vaporization unit 13 a mean vaporization or release rate with a precision of ±10%, preferably maximally ±3% can be set, preferably even maximally ±1%. The long-time drift of the mean vaporization rate settable at the electron beam vaporization unit 13 should be minimal because the processes addressed here, due to the slow layer growth, are relatively lengthy processes. This drift of the mean rate is preferably less than 5% of the reference value in 20 minutes, therein even preferably less than or equal to 0.5% in one hour.

When a mean rate r or a rate averaged over time is mentioned, this means $$r = \frac{1}{T} \int_t^{t+T} r_m(t)\, dt \text{ where}$$

$r_m$ signifies the instantaneous rate and T the averaging time of preferably 10 seconds.

On the back side of the workpiece carrier 3 is preferably provided a pumping port 15 for evacuating the vacuum recipient 1 and potentially also for the control of the partial pressure of oxygen in the process volume P. The pumping port 15 is connected with a vacuum pump 17 whose pumping output can be set at a unit 19.

In the region of the workpiece carrier 3, preferably on the workpiece carrier 3, is provided a temperature sensor 21 whose output signal serves either for monitoring the workpiece carrier temperature or preferably, and as shown, is carried as a instantaneous temperature value signal $X^U$ to a regulating circuit, shown schematically at 23. The temperature regulating circuit 23 is controlled by a temperature control unit 25 and acts with a setting signal, according to the amplified regulating difference $S^U$ on the setting input $E_3$ for the workpiece carrier temperature $^U$. The workpiece temperature is set to maximally 900° C., preferably to maximally 600° C.

With the gas inlet arrangement 7 is further connected a sensor unit 27 by means of which the oxygen mass flow m is measured. In its place can also be measured the partial pressure of the oxygen in the chamber. The gas mass flow m introduced into the chamber 1 yields the partial pressure of the oxygen in the chamber according to the suction power set at the vacuum pump 17 as well as according to the oxygen consumed by the oxidation reaction.

The output signal of the sensor unit 27 is consequently either used for control purposes or, and this preferably and as shown, is supplied as measured manipulated variable signal $X_m$ to a regulating circuit 29 which acts by a setting signal $S_m$ on the input $E_9$ of the actuator unit 9. By means of a throughflow quantity control unit 31 the quantity of gas supplied to the chamber 1 per unit time, the gas mass flow m, is controlled in the sense of regulation.

Lastly, a measurement of the metal rate is carried out. For this purpose a metal-selective rate sensor 33 is provided, and specifically preferably in an angular range at which a workpiece O on the workpiece carrier 3 sees the metal source, consequently the vaporized surface—area of release—at the vaporization unit 13. The rate sensor has preferably a detection sensitivity of $\leq 0.1$ $\text{Ås}^{-1}$, therein preferably even of $\leq 0.01$ $\text{Ås}^{-1}$. For technical reasons of regulation the utilized rate sensor 33 has preferably a response time (step response) of $\leq 100$ ms, preferably $\leq 10$ ms or preferably even $\pm 1$ ms. The latter corresponds in an installation configuration as shown to the time in flight of vaporized metal particles with a kinetic energy of $\leq 10$ eV, if between vaporized metal surface and the workpiece surface to be coated a distance of approximately 50 cm is maintained.

In order to fulfill these specifications a quadruple mass spectrometer is preferably used as the sensor 33, such as a mass spectrometer QMA400 distributed by the applicant.

Furthermore, it is preferably, and as will be explained in conjunction with FIG. 2, largely prevented that the sensible rate sensor 33 is influenced by oxygen gas. For this purpose in a further preferred embodiment variant the gas shower 7a is disposed within a pressure stage chamber 8 with diaphragm opening 8a. The pressure within the pressure stage chamber 8 is increased relative to the pressure in the remaining process chamber P by introducing by nozzle the oxygen, wherein this pressure difference, at least partially, is acquired through the action of the diaphragm 8a. It is thereby prevented that significant quantities of oxygen are found in the region of sensor 33.

Furthermore, it is thereby ensured that, as shown in dashed lines, metal particles and oxygen arrive essentially separately on the workpiece surface and consequently the metal oxide layer is grown in situ, i.e. on the surface.

Figure 2:
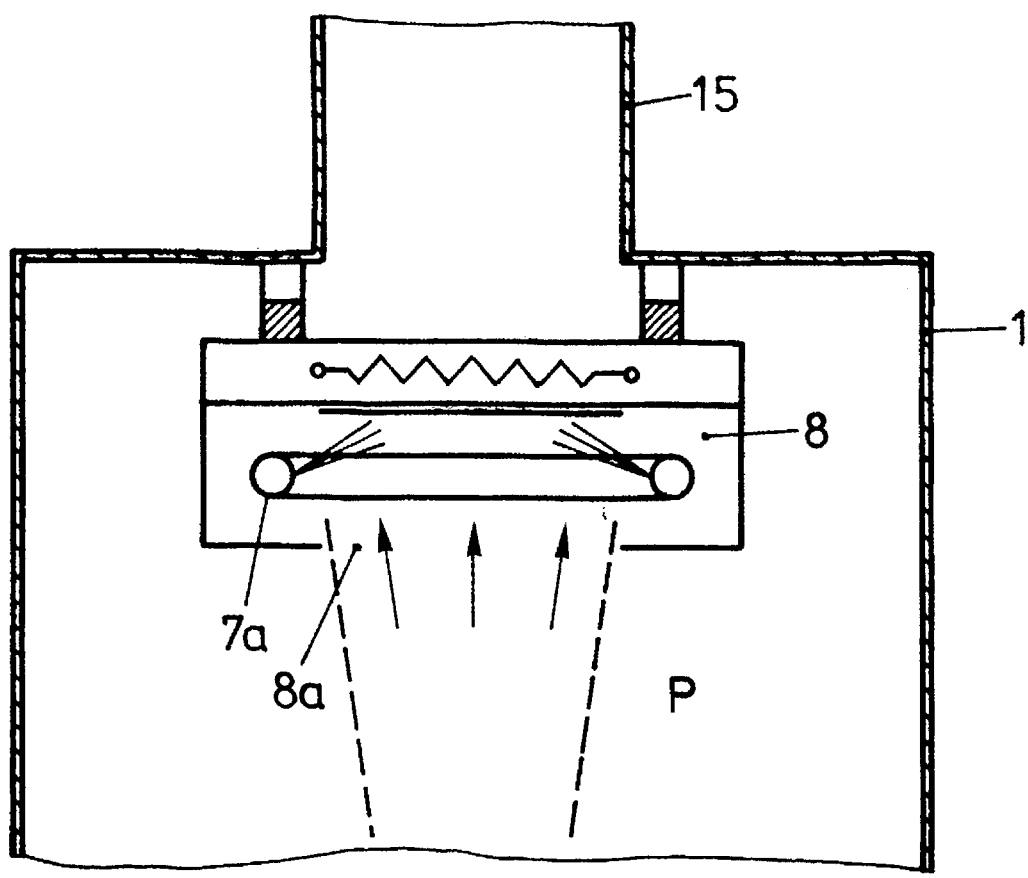
FIG. 2 is a sectional view of a further embodiment of the vacuum chamber used in the apparatus of FIG. 1.

The remaining aggregates depicted in FIG. 1 are not shown in FIG. 2.

The variable measured with the sensor 33 depending on the instantaneous vaporization rate obtaining over the vaporization surface, is either used for control purposes for the vaporization rate or, and this preferably and as shown, supplied as measured regulating variable $X_r$ to a regulating circuit 35 which with the setting signal $S_r$ at input $E_{13}$ of the electron beam vaporization unit 13 sets the instantaneous vaporization rate. The regulating circuit is controlled with a rate control unit 37.

With respect to the structure and the function of a rate setting and preferably regulating circuit of this type for the highly precise setting of extremely low rates at an electron beam vaporizer of the preferred structure, for the expert reference is made to the full extent to U.S. Pat. No. 5,041, 712 (DE-OS-39 21 040) with its entire disclosure content.

The metal particle source, such as preferably an electron beam vaporizer according to U.S. Pat. No. 5,041,712, preferably has setting times for the rate of maximally 100 ms, preferably of maximally 10 ms or even maximally 1 ms.

In the installation, such as is shown schematically in FIG. 1, the process according to the invention is carried out as follows: the vacuum recipient 1 is evacuated by means of the vacuum pump 17 to at least high vacuum, and preferably ultra high vacuum, i.e. to an initial pressure of $\leq 10^{-6}$ mbars, therein preferably to $\leq 10^{-9}$ mbars. Thereby the impurity of the subsequently fed process gas, of the oxygen, by residual gas is minimized.

With the electron beam vaporization unit 13 metal is vaporized and oxygen is introduced into the vacuum chamber 1 via the gas inlet arrangement 7 or 7a. Therein the ratio of the quantity of oxygen introduced per unit time i.e. the oxygen mass flow m, to the average quantity of metal vaporized per unit time, its rate r, is selected so that the vaporized metal oxidizes at a given degree of oxidation and is homogeneously distributed preferably primarily on the substrate, i.e. the workpiece surface O to be coated. The substrate temperature is kept at a minimum, preferably below 900° C., and more preferably below or equal to 600°. The term "metal" is meant to include metal and semimetal.

With iridium as the metal under the following conditions of the process according to the invention excellent results are obtained:

Using the apparatus according to FIG. 1 with the above stated preferred electron beam vaporization unit and preferred rate regulation as well as with a distance of 50 cm between workpiece surface and vaporization area: vaporization or release rate of the metal r averaged over 10 s: $\leq 0.3$ $\text{nms}^{-1}$, partial pressure O in the process volume P at the substrate region: $\leq 8 \cdot 10^{-4}$ mbars.

Four of ten coated parts approximately 15 mm² in size could subsequently be used as electrochemical sensors.

Therein in the production of the layer the partial pressure of oxygen and, consequently, m could be kept constant during the coating process and also rate r.

A further improvement of the layer production was achieved as will be explained in conjunction with FIG. 3. Under the above stated conditions an $Ir_2O_3$ layer was vapor-deposited onto an Ir substrate, on the one hand, and, on the other, onto a sapphire substrate. The vaporization rate r was therein regulated to be constant as shown in FIG. 3, and also the temperature of the layer substrate at 600° C., as was already the case in the above stated example.

Figure 3:
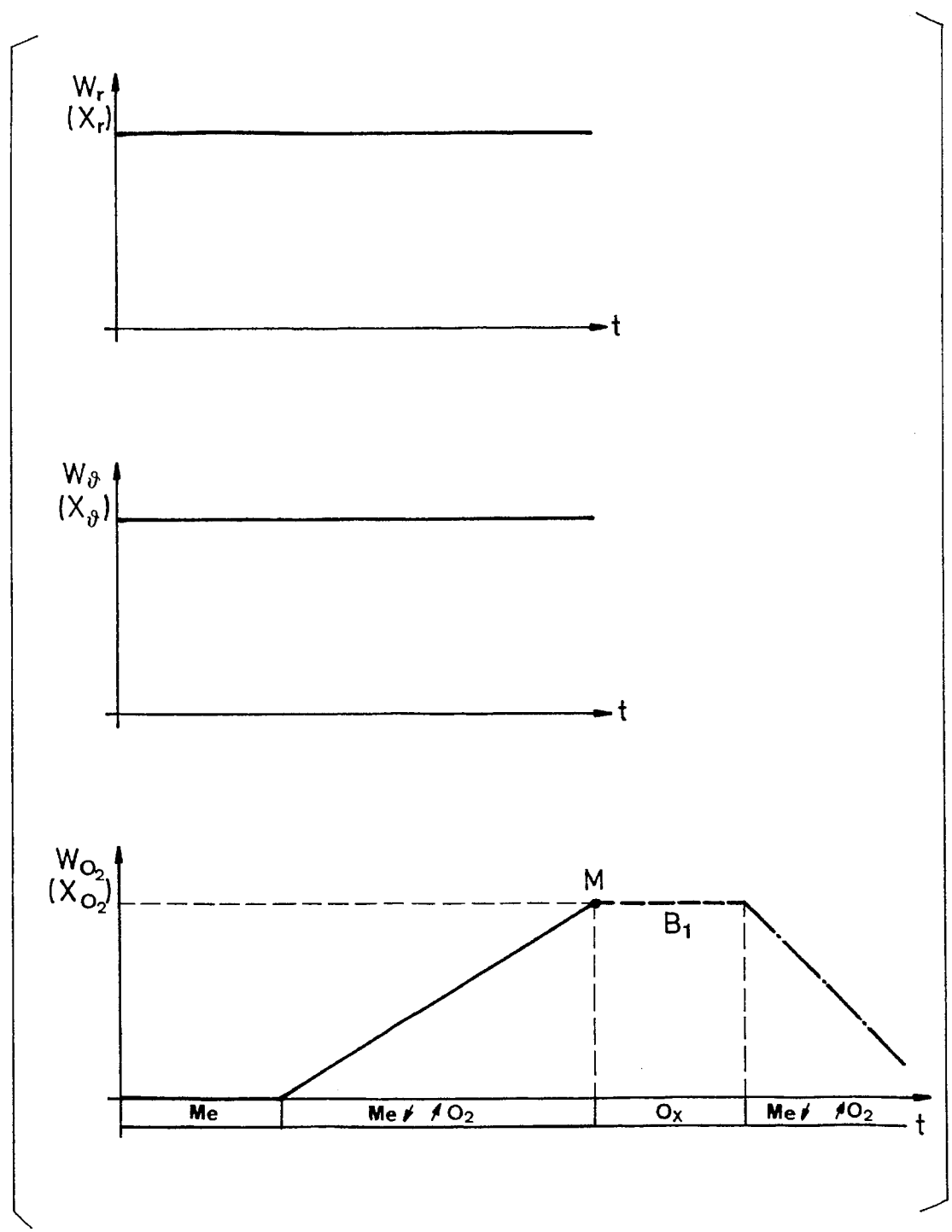
FIG. 3 is a multipart graph on a time axis, showing a regulated or controlled course of the rate of the released metal, in particular through electron beam vaporization, the substrate temperature as well as the mass flow rate of the introduced oxygen, the latter for the application of a metal oxide layer according to the invention onto a metal substrate or the covering of the generated metal oxide layer subsequently with a metal covering.

First, as depicted schematically in FIG. 3, with the curve of the oxygen mass flow, no oxygen was let into the vacuum recipient 1 according to FIG. 1. Consequently, first on the sapphire substrate or the iridium substrate a metal layer was grown. Subsequently, m was increased during a predetermined time, during 50 minutes, and specifically continuously, in the form of a ramp. After termination of the increase of the mass flow m of oxygen according to point M of FIG. 3, subsequently for at least 1000 sec continued coating took place with desired constant oxidation degree.

The result showed that 100% of the coated parts, again approximately 15 mm² large, could be used as electrochemical sensors. The adhesion of the layer was tested with the adhesive strip test: the grown layer could only be removed with a marking tool. This was the case on the sapphire substrate as well as also on the metal substrate.

A shortening of the ramp length for reasons of process technology, namely time and throughput, can be shortened to approximately 5 minutes. The minimum size must be determined experimentally for each metal/metal oxide layer system which is produced according to the invention. Due to the realized oxidation degree profile the service life of the electrochemical sensor parts compared to those without oxidation degree profile, was increased drastically. If, as is also evident in FIG. 3, subsequently on the metal oxide layer produced according to the invention again a metal layer is to be deposited, the degree of oxidation is again continuously reduced through a preferably ramp-form decrease of the oxygen mass flow m, with which the layer structure becomes increasingly more metallic.

Figure 4:
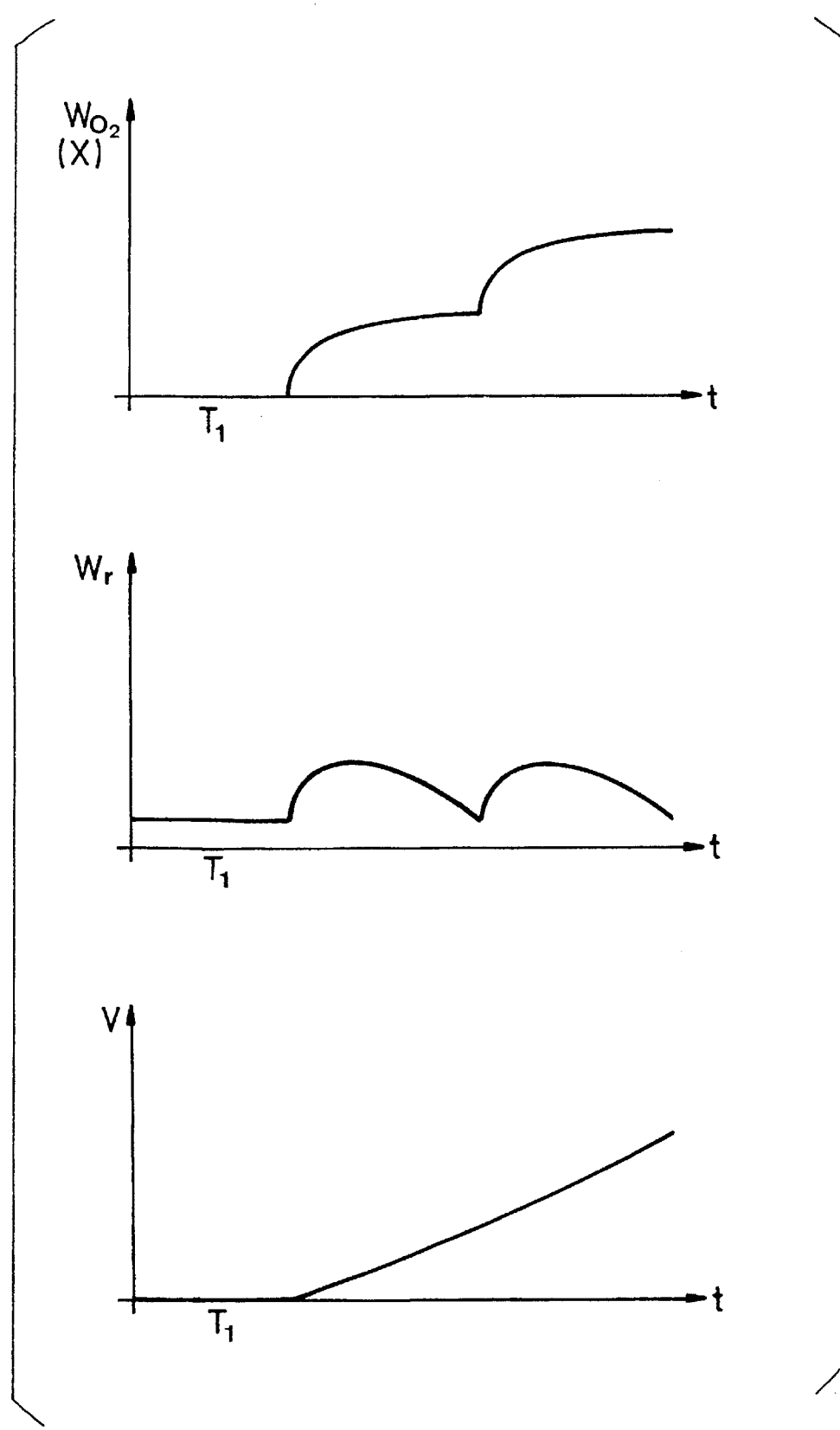
FIG. 4 is a graph similar to FIG. 3 qualitatively showing an example of the regulated or potentially controlled curve of the mass flow of the oxygen introduced and the curve of the quantity of metal set free per unit time or the quantity of metal electron beam vaporized as well as a for example resulting curve of the ratio (V) of the oxygen mass flow and metal rate, wherein the oxygen mass flow is adjusted at greater time intervals and, for obtaining the desired ratio, the metal rate is controlled so as to follow.

FIG. 4 schematically represents a further variant of the process. Here, in a first time phase $T_1$, metal is deposited for example onto a metal substrate. For this purpose an appropriate vaporization rate r is set and no oxygen is introduced. Subsequently, the oxygen mass flow (according to its reference value $W_{O2}$) is increased in one step. The inertia is depicted qualitatively exaggerated, with which the oxygen mass flow and, in particular, the partial pressure in the recipient reacts to a control step. The rate of vaporized material, corresponding to its reference value $W_r$, is controlled so that according to the particular obtaining instantaneous oxygen mass flow, a desired instantaneous ratio of oxygen to metal obtains at the surface to be coated in order to achieve instantaneously the desired oxidation degree. For this purpose rate r is controlled as a function of m.

In this way a continuous increase of the oxidation degree can be achieved according to a continuous increase of the ratio of oxygen to metal, but wherein this process can be used in particular when a desired profile of the oxidation degree cannot be realized through a continuous change of the oxygen mass flow or not solely by changing this mass flow in relatively large time segments. This for the reason that a rapid change of the oxygen mass flow, due to the inertia with which the latter reacts to changes of the reference value, is not possible to the same extent as a rapid and precise technical regulating control of the rate of metal vaporized.

Figure 5:
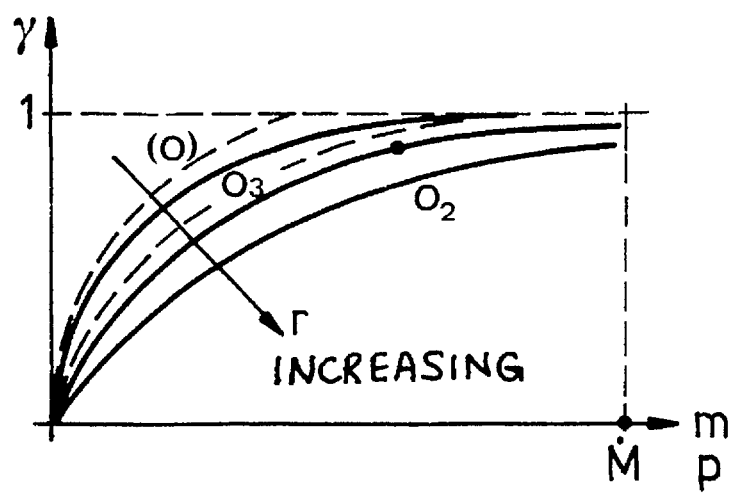
FIG. 5 is a graph qualitatively showing the oxidation degree as a function of the mass flow of the oxygen introduced, in each instance at different constant rates of the metal set free, at a given installation configuration.

In FIG. 5 is depicted schematically the oxidation degree as a function of the oxygen mass flow m. This at different constant metal vaporization rates r and at constant suction power and substrate temperature. It can be seen that with increasing oxygen mass flow m the degree of reaction moves toward the value 1, and specifically the more rapidly the lower the constant vaporization rate r is.

If at constant vaporization rate r a curve is considered, such as depicted for example at $O_2$, at the same ratios but with the feeding of excited oxygen O or $O_3$, due to the higher oxidation yield already at lower reactive gas flows m, interestingly, a saturated oxidation results. On that basis it can be seen that a possibility for increasing the metal vaporization rate r in order to build layers according to the invention more rapidly, resides in increasing the reactivity of the oxygen by supplying excited oxygen. It is also possible through the selective feeding of differently excited oxygen to control an oxidation degree profile.

Figure 6:
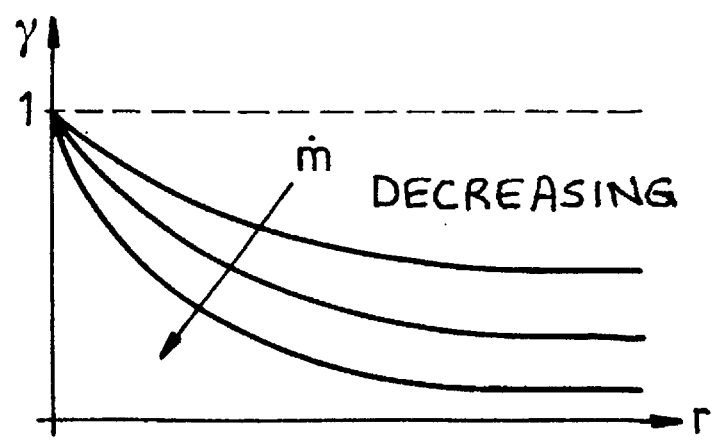
FIG. 6 is a graph analogous to FIG. 5 of the oxidation degree as a function of the rate of the metal set free each at a constant mass flow of the oxygen introduced.
Figure 7:
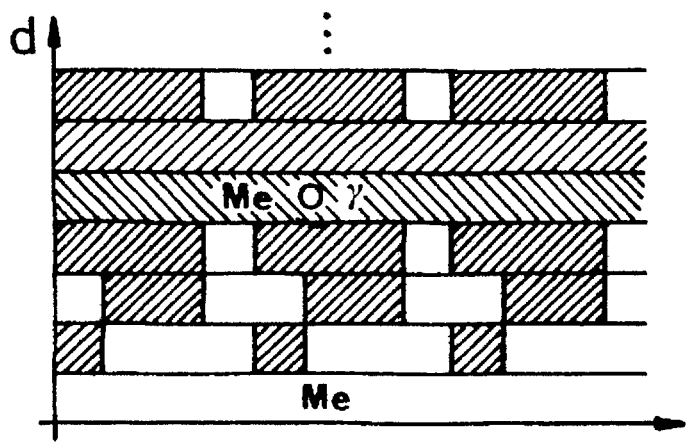
FIG. 7 is a schematic illustration of the structure according to the invention of a layer according to the invention, in particular on a metal substrate to ensure optimum layer adhesion.

In FIG. 6, analogously to FIG. 5, the degree of oxidation is shown as a function of the vaporization rate r, in each instance with the oxygen mass flow m kept constant. In FIG. 7 the structure of a preferred layer according to the invention is depicted, as is realized in the procedure according to FIG. 3 or 4 or through the control of the fraction of excited oxygen. Therein signify, purely qualitatively, the dark regions the oxidic layer components. On that basis it can be seen that a continuous transition of the degree of oxidation between metal layer and metal oxide layer with the desired degree of oxidation takes place, which, as has been shown, increases significantly the adhesion of the layer on the substrate. It is shown, how with the preferred control according to the invention of the profile of the degree of oxidation, between metallic and oxidic domain the degree of oxidation changes from monolayer to monolayer.

This percolative effect permits that the layer built up in this way can absorb pressure as well as also transverse stresses to a significantly increased degree.

Although the example stated above assumes the application on a metal layer according to the invention of a metal oxide layer of the same metal, it is entirely possible to produce metal layer and metal oxide layer of different metals or to apply the metal oxide layer on a non-metallic substrate, as has been shown, sapphire, according to the invention.

Figure 8:
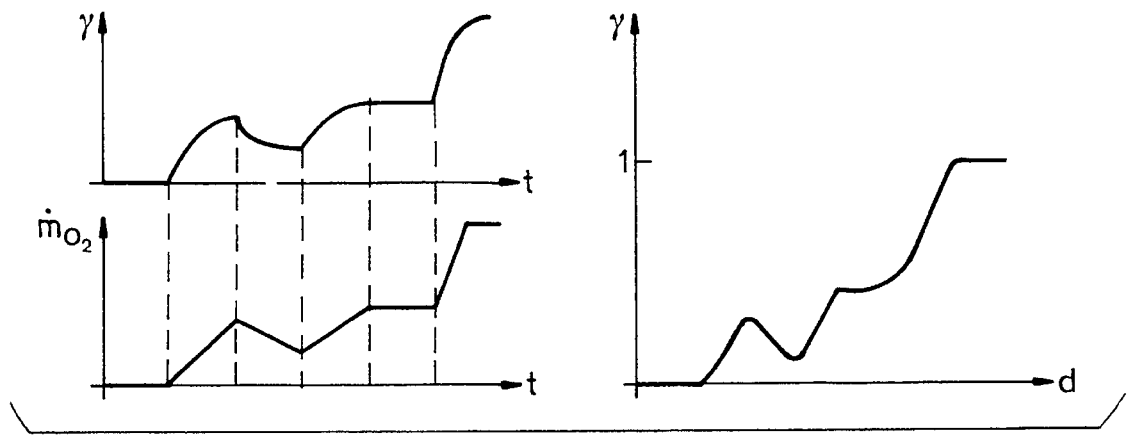
FIGS. 8 and 9 are each multipart qualitative curves, by example, of oxygen mass flow, the oxidation degree resulting therefrom at a constant rate of metal release and the oxidation degree profile resulting therefrom over the thickness of the layer according to the invention building up.
Figure 9:
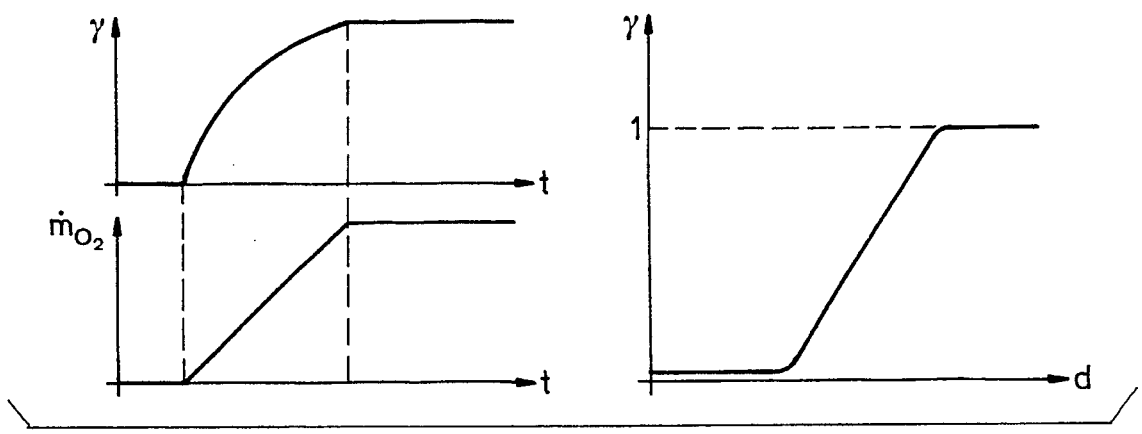

In FIGS. 8 and 9 is shown how the oxygen feed, corresponding to m, is controlled specifically over the time t and consequently the distribution of the degree of oxidation over time in order to obtain layers with the desired profile of oxidation degree over its thickness d.

Figure 10:
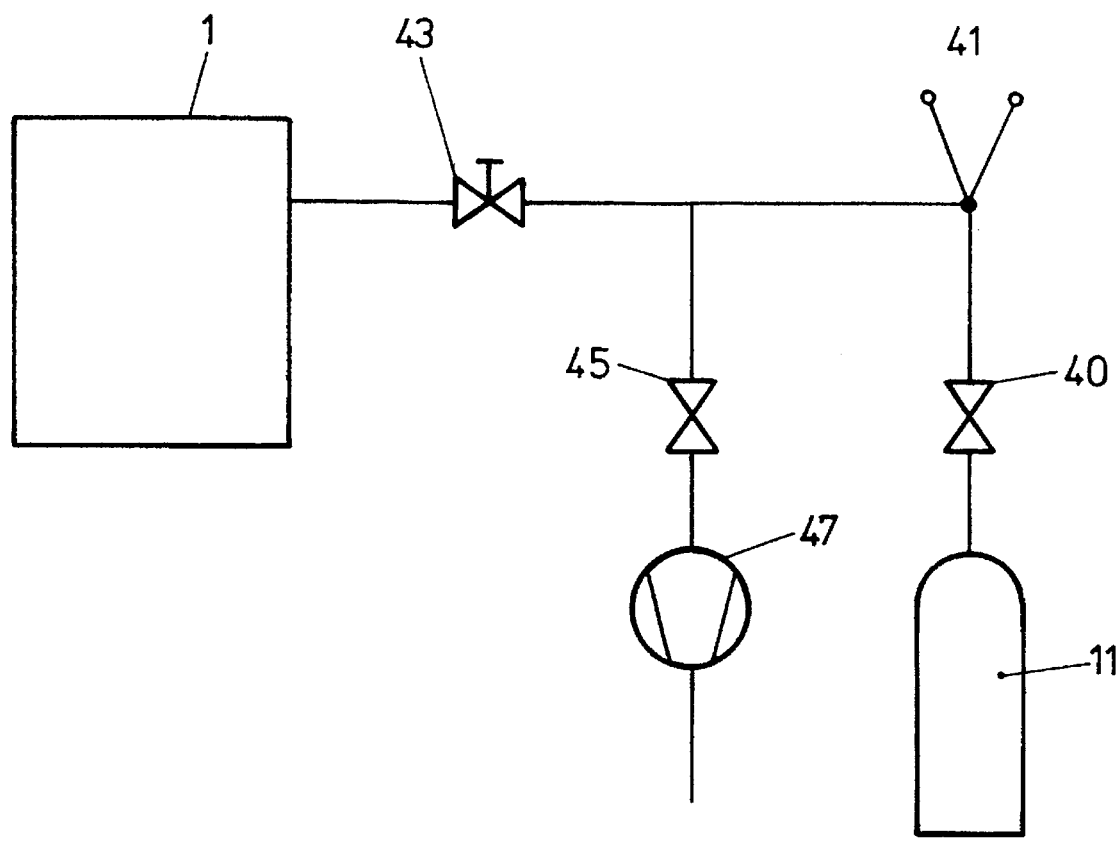
FIG. 10 is a diagram showing the connection of an oxygen reservoir with the vacuum chamber to explain purification cycles for the connection line system between reservoir and vacuum chamber.

According to FIG. 10 which depicts a preferred addition to the installation according to FIG. 1, the oxygen tank or reservoir 11 is controlled via a first valve 40, a manometer 41, a second valve, namely a choker valve 43, to the chamber 1, as depicted in FIG. 1. Between the first and second valve 40, 43, a pump port with a pump 47 branches off via a third valve 45. This arrangement serves for connecting the oxygen reservoir 11. The space between the valves 43, 45, and 40 is ventilated before connecting the tank 11. Subsequently, the tank 11 is installed, the valves 40, 43, 45 are closed. Valve 45 is subsequently opened and by means of pump 47 evacuation takes place to a final pressure of $\leq 10^{-2}$ mbars. Preferably $\leq 10^{-7}$ mbars. Simultaneously, the line system between valves 40, 43, 45 is preferably heated, preferably to at least 200° C. After evacuating the line volume, valve 45 is closed and the gas from tank 11, after opening valve 40 is expanded into the line volume between valves 43 and 45. Thereupon valve 40 is closed, valve 45 opened and this cycle is preferably repeated several times, preferably at least five times before the oxygen reservoir 11, after closing valve 45, is connected with the vacuum chamber 1 controlled via valves 40 and 43.

Therewith it is avoided that the coating carried out according to the invention is unintentionally doped through impurities from the stated line system.

According to the procedure according to the invention, furthermore, $SiO_2$ layers were grown on Si. The measured vaporization rate corresponds to a layer growth on the substrate of less than 0.5 Ås$^{-1}$, which corresponds to less than 0.1 monolayer per second. Therewith a coating time of 10 s was achieved per monolayer. The rate averaged over time fluctuated less than ±1%. At a constant oxygen mass flow, consequently, monolayers with an oxidation degree precision of ±1% could be produced in a regulated way.

While a specific embodiment of the invention has been shown and described in detail to illustrate the application of the principles of the invention, it will be understood that the invention may be embodied otherwise without departing from such principles.

What is claimed is:

1. Process for producing a metal oxide layer on a substrate, the metal oxide layer being free of cracks, the process comprising:

holding the substrate in an evacuated vacuum chamber, evacuated to $10^{-1}$ mbar or lower;

setting particles of a metal free into the chamber, the freed metal particle having a kinetic energy;

introducing oxygen into the chamber;

keeping a temperature of the substrate below 900° C.;

reacting said particles with said oxygen to form metal oxide deposition on said substrate;

steadily raising a ratio of a quantity of the oxygen introduced per unit time into said chamber to the metal particles freed into said chamber per unit time, controlled for each mono-atomic or mono-molecular layer deposited on the substrate, to result in a steadily rising degree of oxidation of metal oxide on said substrate; and limiting the kinetic energy of the metal particles freed into said chamber to a maximum of 10 eV at said substrate.

2. Process as stated in claim 1, wherein the particles of the metal are set free in the chamber at a release rate and so that the release rate averaged over time and over a release area for the metal leaving from a metal particle source is no more than 0.3 nms$^{-1}$ from the source.

3. Process as stated in claim 2, wherein said release rate is no more than 0.01 nms$^{-1}$.

4. Process as stated in claim 1, wherein a precision of a release rate of the metal particles from a metal source, averaged over time and over a release area of the source is $\leq$10% relative to a reference value.

5. Process as stated in claim 4, wherein said release rate is no more than 0.005 nms$^{-1}$.

6. Process as stated in claim 4, wherein said precision is $\leq$1%.

7. Process as stated in claim 1, wherein a drift of a release rate of the metal particles from a metal source averaged over time and over a release area of the source, is $\leq$5% in 20 minutes.

8. Process as stated in claim 7, wherein the drift of the release rate averaged over time and over the release area, is $\leq$0.5% in one hour.

9. Process as stated in claim 1, wherein the substrate or a layer growing on the substrate is acted upon by oxygen and the metal oxide layer is grown in situ.

10. Process as stated in claim 1, wherein the metal is evaporated to set the particles free.

11. Process as stated in claim 10, wherein the metal is evaporated by electron beam.

12. Process as stated in claim 1, wherein a rate of metal being set free from a source of the metal is measured.

13. Process as stated in claim 12, wherein the measurement takes place in a spacial angle range in which the substrate with a region to be coated sees a source of the released metal particles.

14. Process as stated in claim 12, wherein the measurement is carried out by means of a quadruple mass spectrometer.

15. Process as stated in claim 12, wherein a result of said measurement is applied as an instantaneous value measurement in a negative feedback control circuit and setting, by means of a desired value for said rate at said circuit, the degree of oxidation at the mono-atomic or mono-molecular layer being produced.

16. Process as stated in claim 12, wherein said measuring is performed with a material-selective rate sensor having a detection sensitivity of $\leq$0.1 Ås$^{-1}$ relative to an amount of said metal released from said metal source.

17. Process as stated in claim 16, wherein said sensitivity is $\leq$0.01 Ås$^{-1}$.

18. Process as stated in claim 12, wherein said measuring is performed with a rate sensor having a response time of $\leq$100 ms.

19. Process as stated in claim 18, wherein said response time is $\leq$10 ms.

20. Process as stated in claim 19, wherein said response time is $\leq$1 ms.

21. Process as stated in claim 12, wherein said measuring is performed in a volume of said chamber separated from a remaining volume by a pressure stage and wherein said oxygen is inlet in said remaining volume.

22. Process as stated in claim 1, wherein at least one parameter is negative feedback controlled, where said parameter is selected from the group consisting of:

(a) the temperature of the substrate, (b) a quantity of the metal set free per unit time, (c) the quantity of the oxygen introduced per unit time, and (d) the ratio of the quantity of the metal set free to the quantity of the oxygen introduced per time unit.

23. Process as stated in claim 22 wherein two of the parameters (a), (b), and (c) are kept constant at least during predetermined coating time spans, and the remaining parameter is negative feedback controlled.

24. Process as stated in claim 1, wherein a first volume of the chamber with the substrate and a second volume where the oxygen is introduced, are separated from a remaining volume of the chamber via a pressure stage.

25. Process as stated in claim 1, wherein the metal oxide layer is produced so that the metal oxide layer is sandwiched between two metal surfaces in that said ratio is reduced after the ratio is increased, to result in a metal being deposited.

26. Process as stated in claim 1, wherein the quantity of the oxygen introduced is varied at larger time intervals than a rate at which the metal particles are set free.

27. Process as stated in claim 1, wherein said oxygen comprises excited oxygen in a form of at least one of ozone, electron excited oxygen, and ions.

28. Process as stated in claim 1, wherein kinetic energy of the oxygen is not greater than 10 eV.

29. Process as stated in claim 1, wherein the oxygen is excited by at least one energy source selected from the group consisting of a glow discharge, a microwave discharge, inductively coupled plasma, and light radiation.

30. Process as stated in claim 1, wherein the substrate temperature is kept at 600° C. at most.

31. Process as stated in claim 1, wherein said metal is Ir.

32. Process as stated in claim 1, wherein an initial process pressure is set to be 10$^{-6}$ mbar or lower.

33. Process as stated in claim 32, wherein said pressure is 10$^{-9}$ gm bar or lower.

34. Process as stated in claim 1, wherein the introducing of the oxygen includes connecting an oxygen reservoir to said vacuum chamber via a first and a second valve, further connecting a pump via a third valve between the first and the second valve, providing connecting lines between said first, second and third valves, heating the connecting lines between the first, second and third valves to at least 200° C., with sequential steps of (a) the first and second valves closed and with the third valve open;

(b) evacuating said lines to at least 10$^{-2}$ mbar;

(c) closing said third valve;

(d) opening said first valve to flood said lines with oxygen;

repeating the steps (a) to (d) at least five times, then closing said first valve and opening said third valve and evacuating said lines and subsequently opening said second valve.

35. Process as stated in claim 1, including the raising of said ratio being performed by controlling a rate of setting the metal metal particles to be constant and continuously increasing the quantity of the oxygen supplied so that said degree of oxidation from one deposited monomolecular layer to a next layer changes in predeterminable manner.

* * * * *